(12) United States Patent
Fornaciari et al.

(10) Patent No.: US 6,714,624 B2
(45) Date of Patent: Mar. 30, 2004

(54) DISCHARGE SOURCE WITH GAS CURTAIN FOR PROTECTING OPTICS FROM PARTICLES

(75) Inventors: Neal R. Fornaciari, Tracey, CA (US); Michael P. Kanouff, Livermore, CA (US)

(73) Assignee: EUV LLC, Santa Clara, CA (US)

( * ) Notice: Subject to any disclaimer, the term of this patent is extended or adjusted under 35 U.S.C. 154(b) by 280 days.

(21) Appl. No.: 09/956,275

(22) Filed: Sep. 18, 2001

(65) Prior Publication Data

US 2003/0053594 A1 Mar. 20, 2003

(51) Int. Cl.[7] .................................................. H05G 2/00

(52) U.S. Cl. .......................................... 378/119; 378/34

(58) Field of Search ............................ 378/119, 34, 143, 378/87; 250/504 R

(56) References Cited

U.S. PATENT DOCUMENTS

| | | | |
|---|---|---|---|
| 5,499,282 A | | 3/1996 | Silfvast et al. |
| 5,577,092 A | | 11/1996 | Kubiak et al. |
| 5,963,616 A | | 10/1999 | Silfvast et al. |
| 6,031,241 A | | 2/2000 | Silfvast et al. |
| 6,198,792 B1 | * | 3/2001 | Kanouff et al. ................ 378/34 |
| 6,232,613 B1 | * | 5/2001 | Silfvast et al. .......... 250/504 R |
| 6,356,618 B1 | * | 3/2002 | Fornaciari et al. ........... 378/119 |

FOREIGN PATENT DOCUMENTS

EP      0 174 877 A1    3/1986

OTHER PUBLICATIONS

Mirkarimi, P.B. et al., "Advances in the reduction and compensation of film stress in high–reflectance multilayer coatings for extreme ultraviolet lithography", SPIE vol. 3331, pp133–148.
Klosner, M.A. et al., "Intense plasma discharge source at 13.5 nm for extreme–ultraviolet lithography", Optic Letters, vol. 22, No. 1, 1997, pp. 34–36.
Kubiak, G.D., et al., "High–power extreme ultraviolet source based on gas jets", SPIE vol. 3331, pp. 81–89.
Klosner, M.A. et al., "Intense xenon capillary discharge extreme–ultraviolet source in the 10–16–nm–wavelength region", Optics Letters, vol. 23, No. 20, 1998, pp. 1609–1611.
Silfvast, W.T., et al., "High–power plasma discharge source at 13.5 nm and 11.4 nm for EUV lithography", Proceedings of SPIE, Yuli Vladimirsky, 3676, pp. 272–275, 1999.
Dedkov, V.S. et al., "Properties of Rhombohedral Pyrolytic Boron Nitride", Inorganic Materials, vol. 32, No. 6, 1996, pp. 609–614.
Duclaux, L., et al. "Structure and low–temperature thermal conductivity of pyrolytic boron nitride", Physical Review B, vol. 46, No. 6, 1992, pp. 3362–3367.
Moore, A.W., "Compression Annealing of Pyrolytic Boron Nitride" Nature "Letters to the Editor", vol. 221, 1969, pp 1133–1134.

* cited by examiner

Primary Examiner—Louis Arana
(74) Attorney, Agent, or Firm—Fliesler Meyer LLP

(57) ABSTRACT

A gas curtain device is employed to deflect debris that is generated by an extreme ultraviolet and soft x-ray radiation discharge source such as an electric discharge plasma source. The gas curtain device projects a stream of gas over the path of the radiation to deflect debris particles into a direction that is different from that of the path of the radiation. The gas curtain can be employed to prevent debris accumulation on the optics used in photolithography.

24 Claims, 12 Drawing Sheets

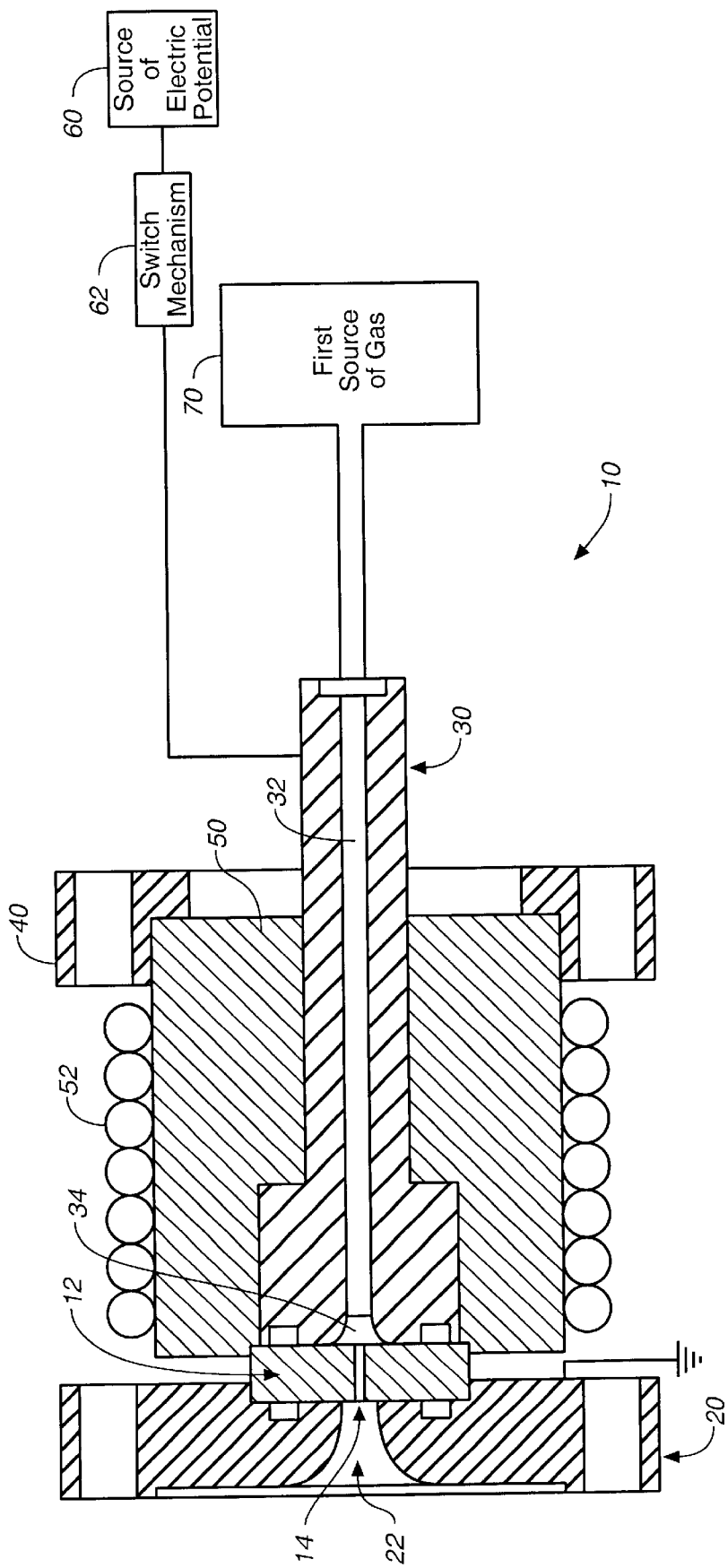
FIG._1

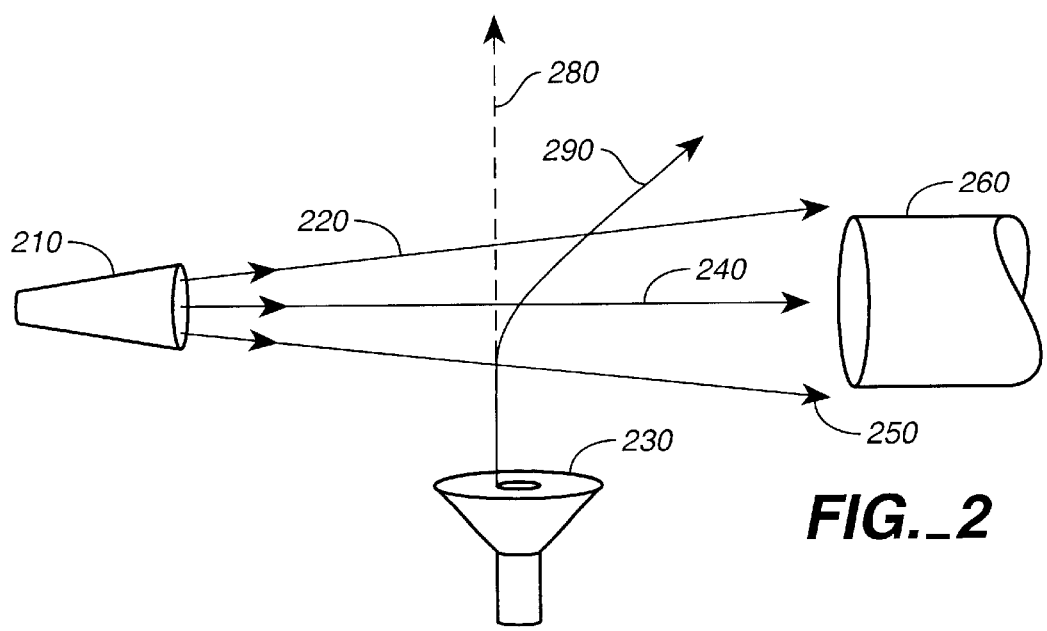
FIG._2
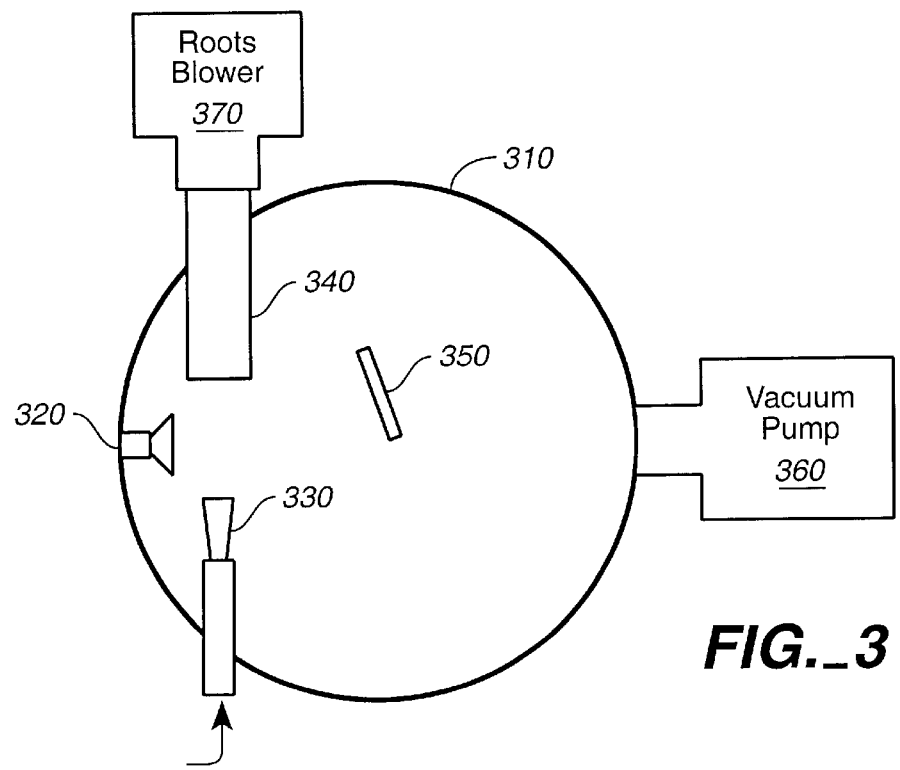
FIG._3

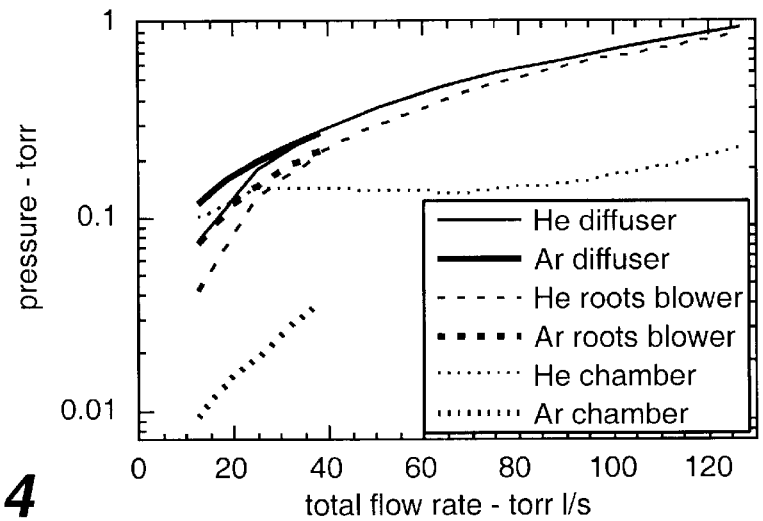
FIG._4
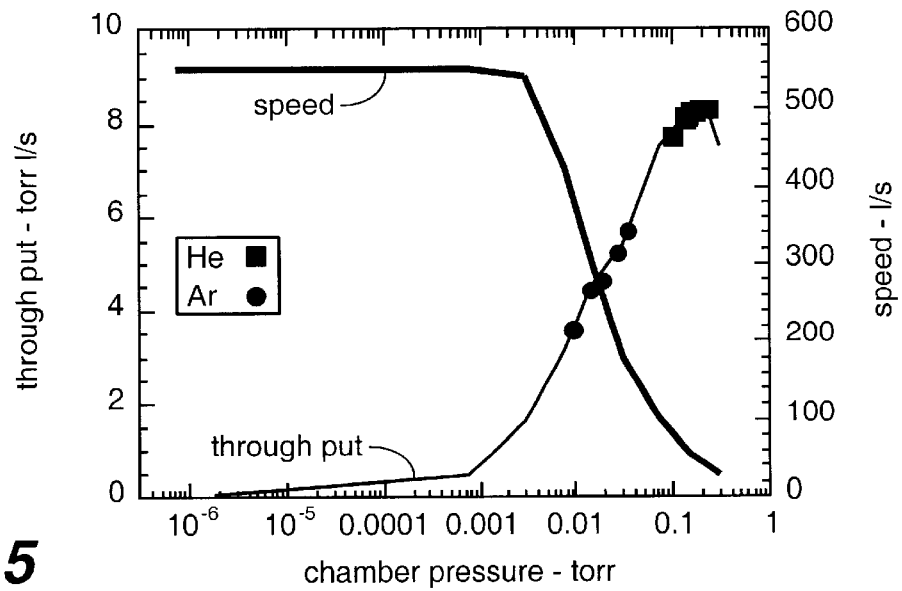
FIG._5
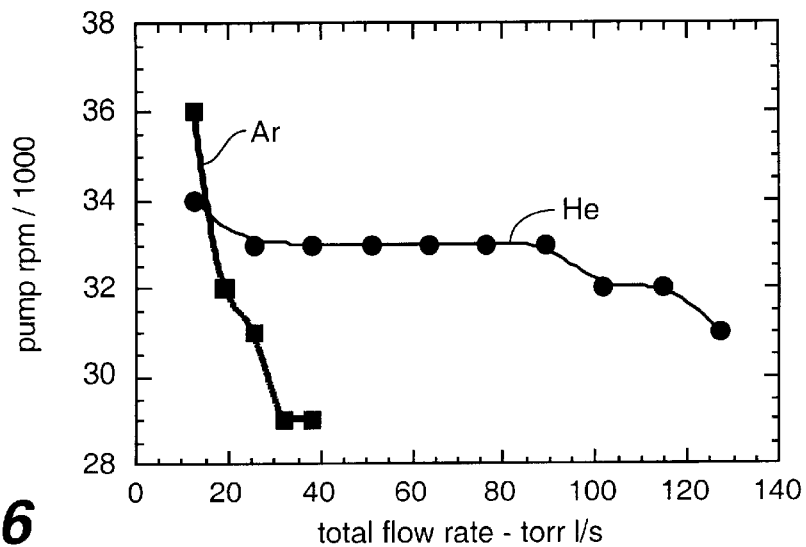
FIG._6

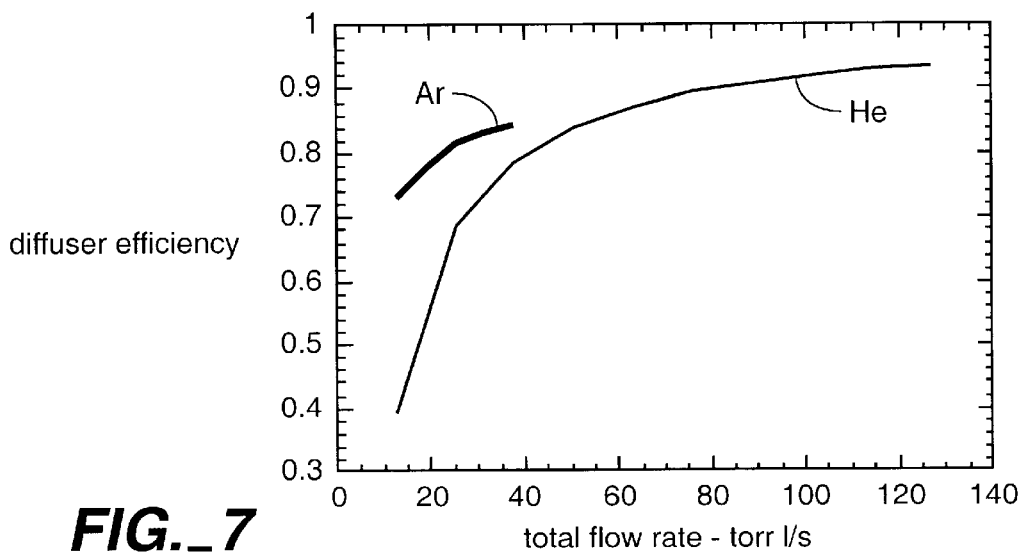
FIG._7
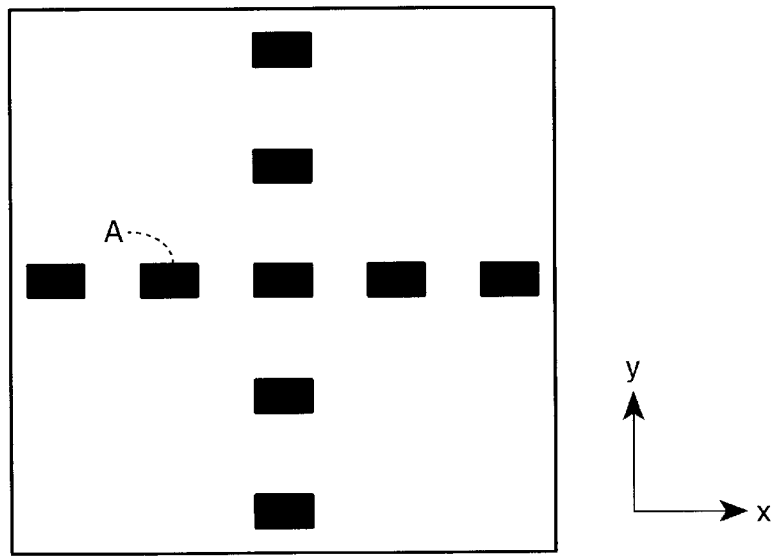
FIG._8
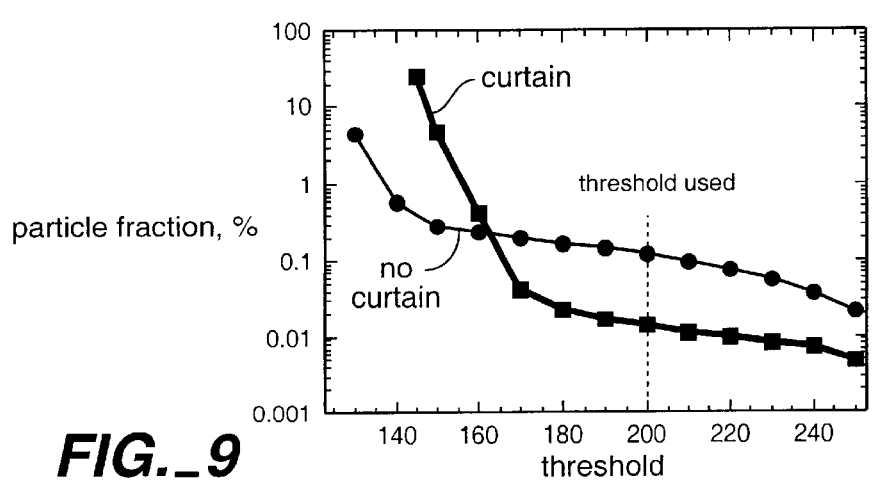
FIG._9

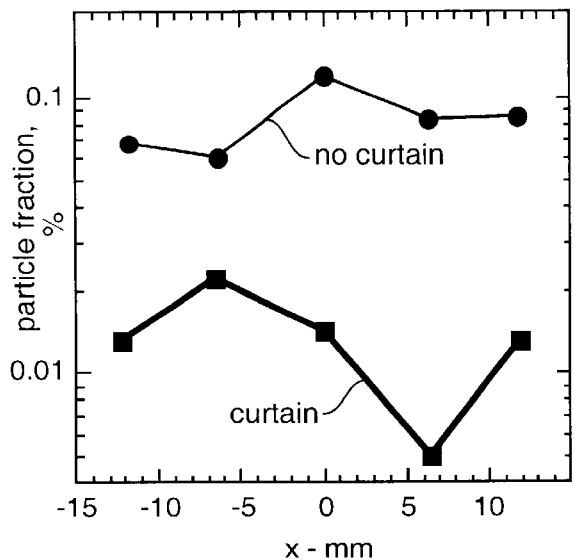
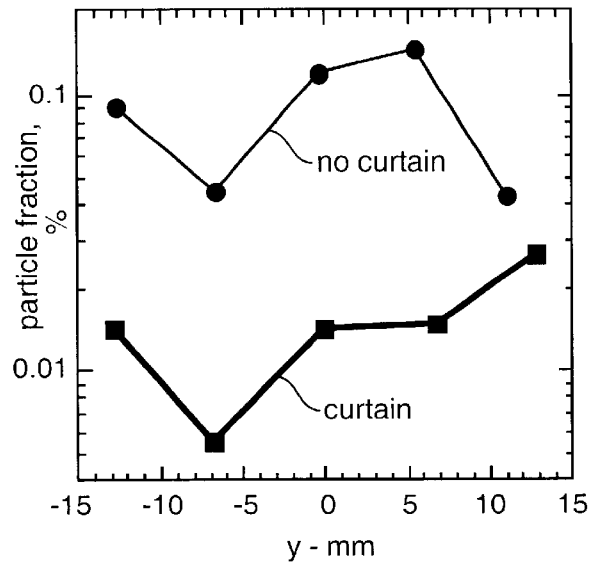
FIG._10a      FIG._10b
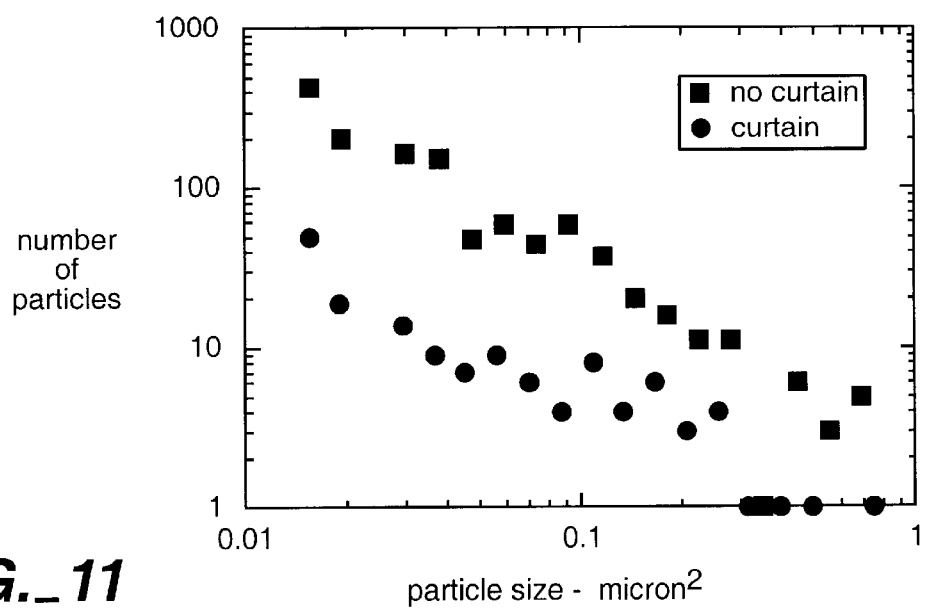
FIG._11

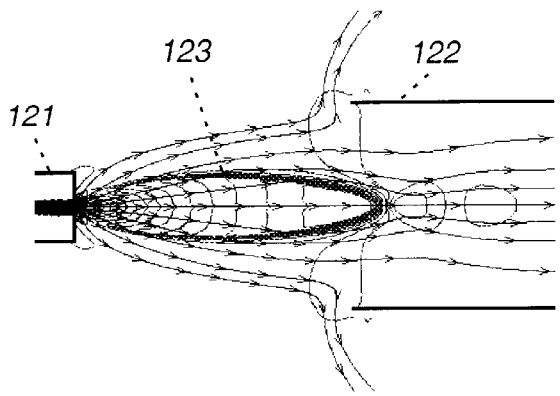
FIG._12
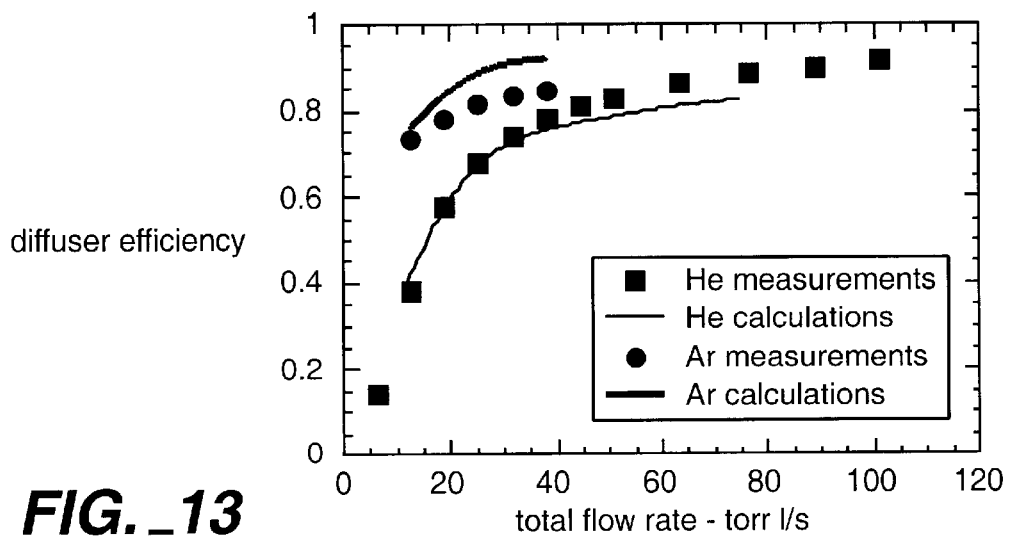
FIG._13
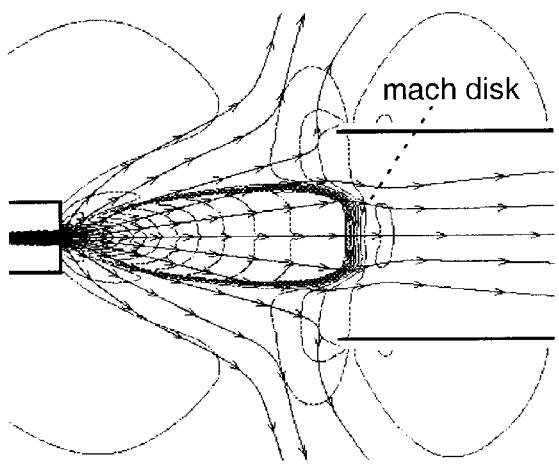
FIG._14

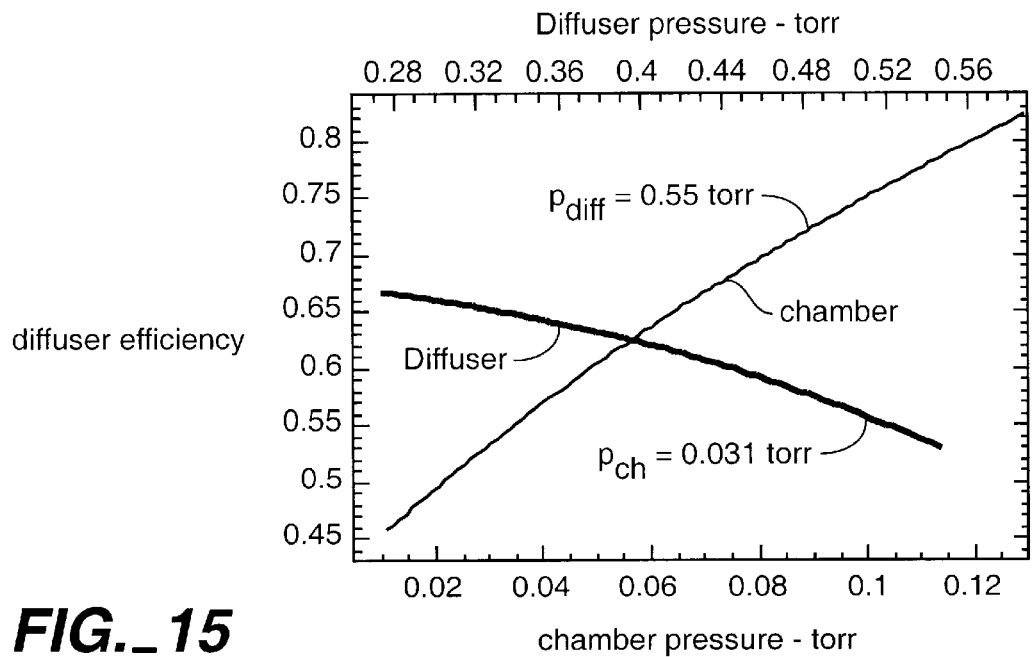
FIG._15
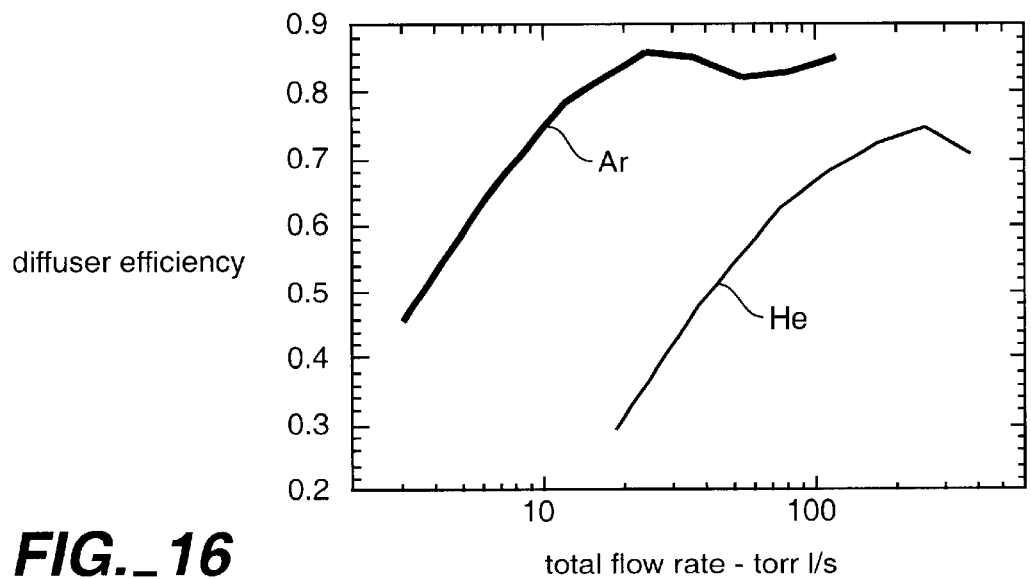
FIG._16
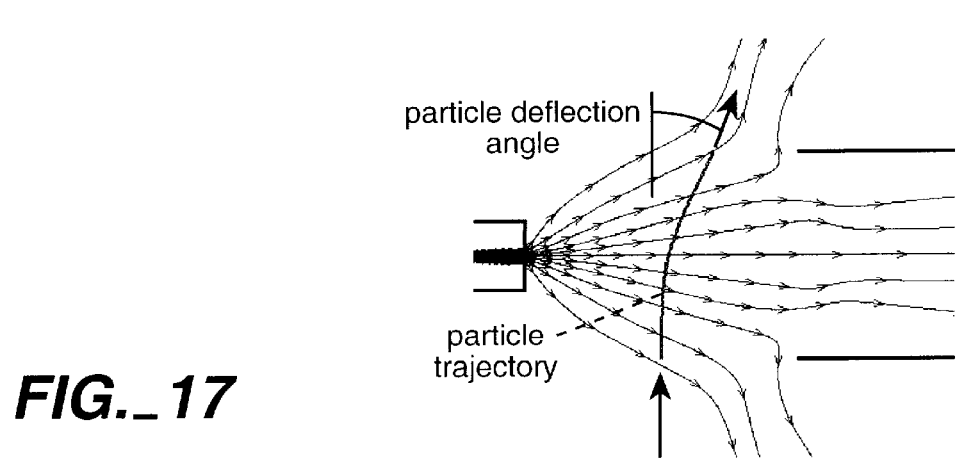
FIG._17

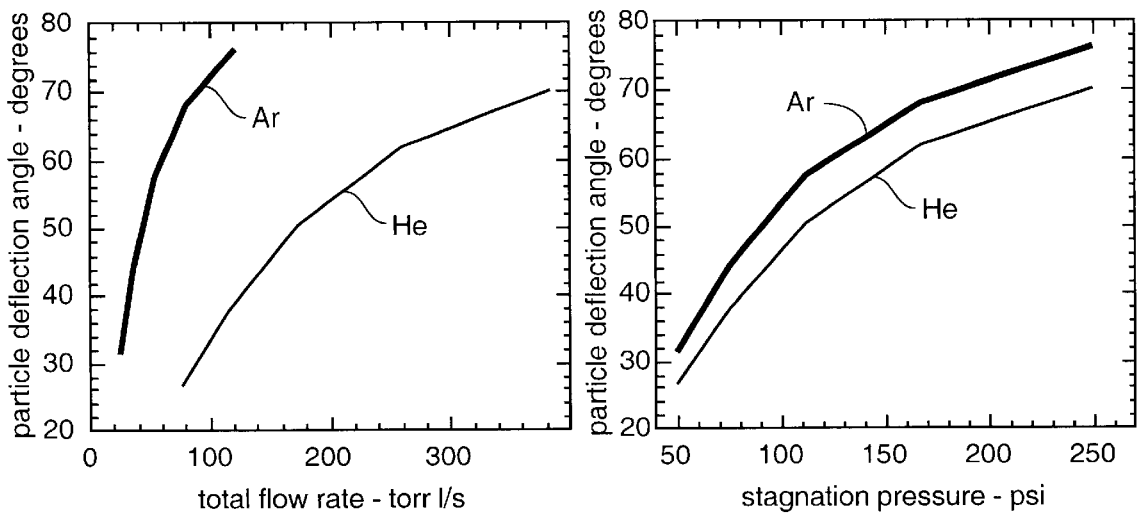
FIG._18a  FIG._18b
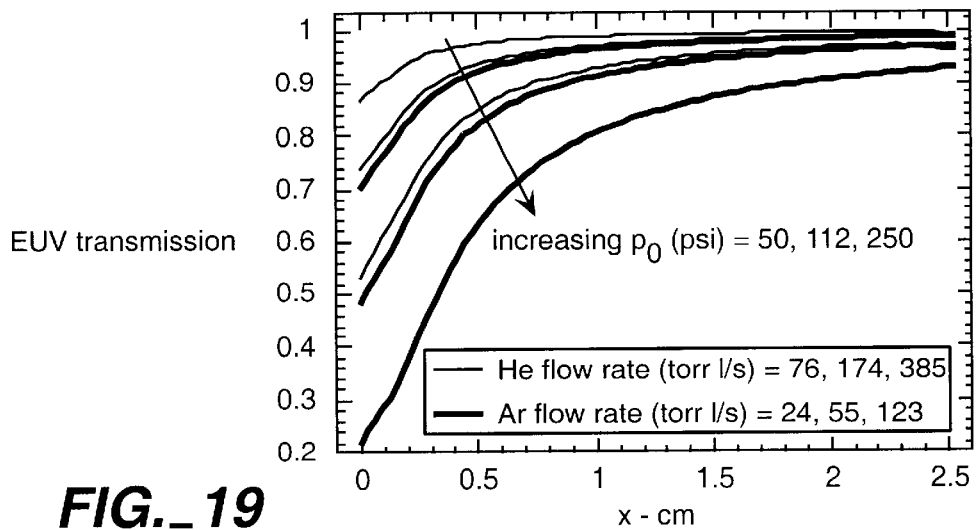
FIG._19

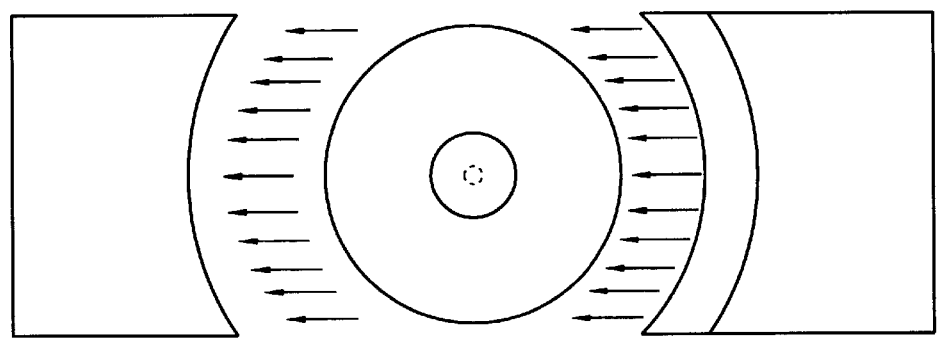
Front View
*FIG._20a*
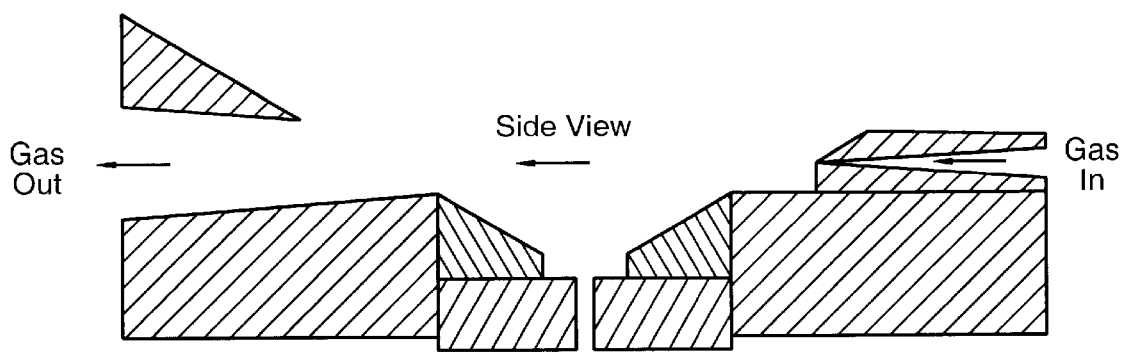
Side View
Gas Out    Gas In
*FIG._20b*
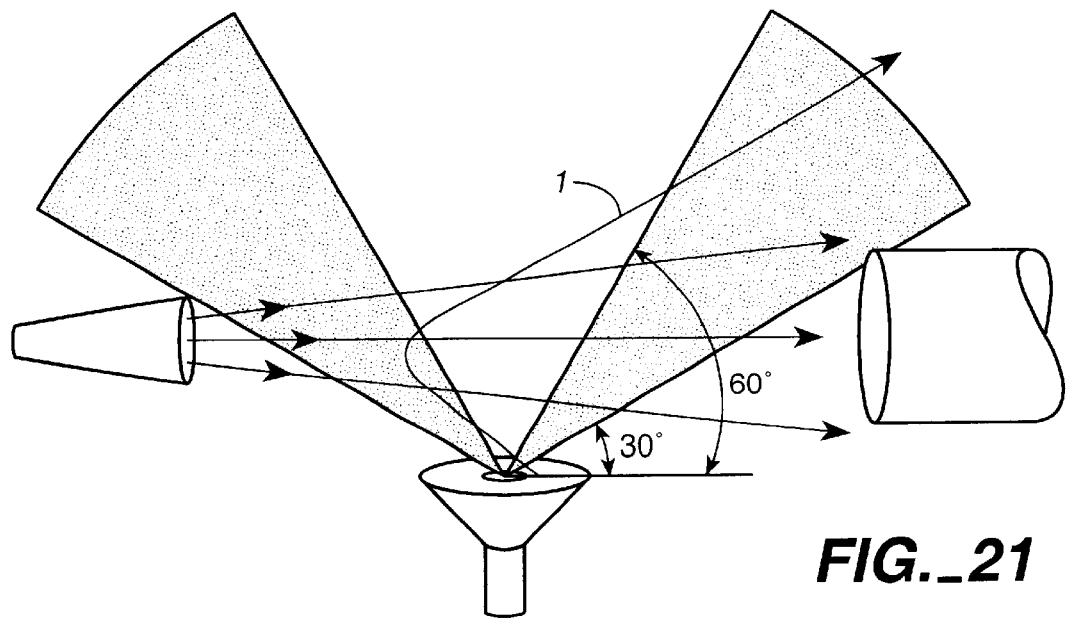
*FIG._21*

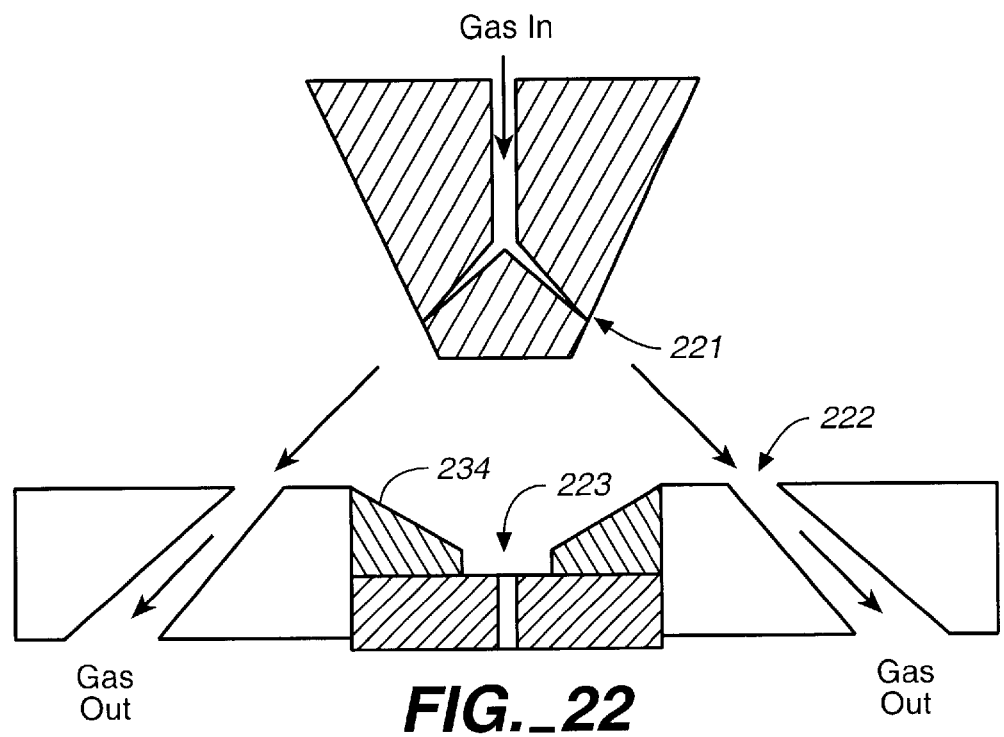
FIG._22
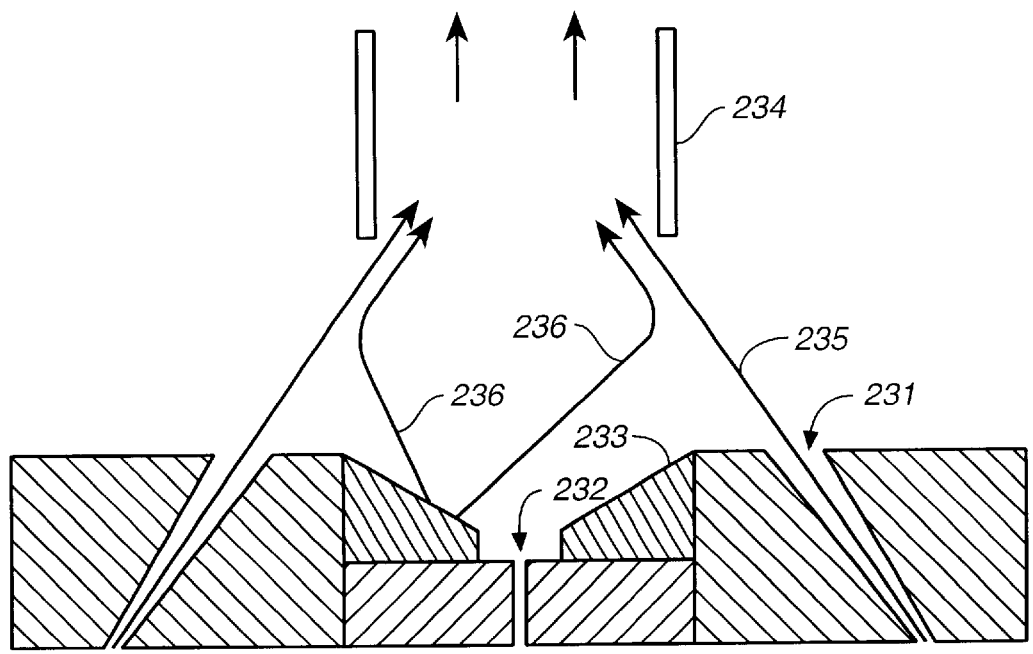
FIG._23

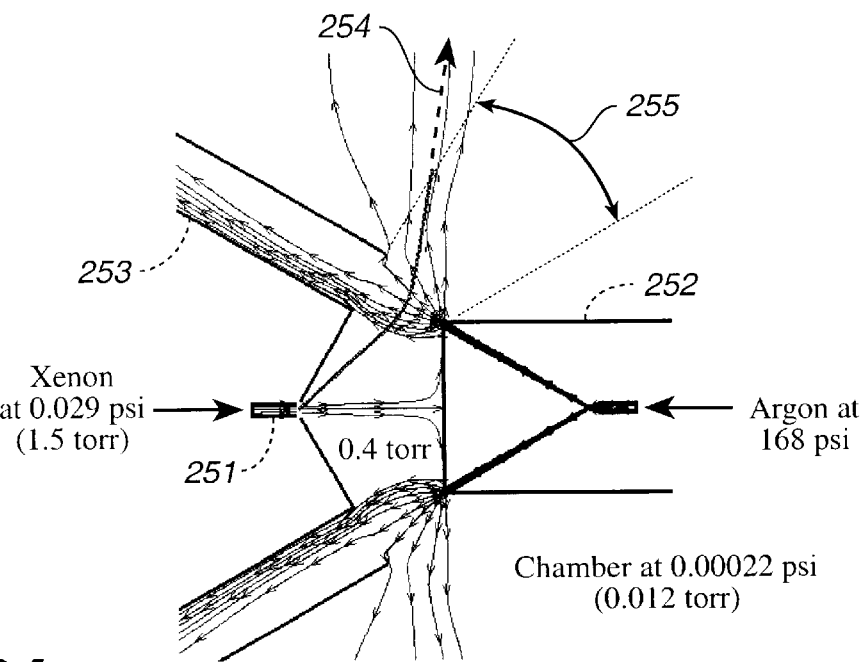
FIG._24
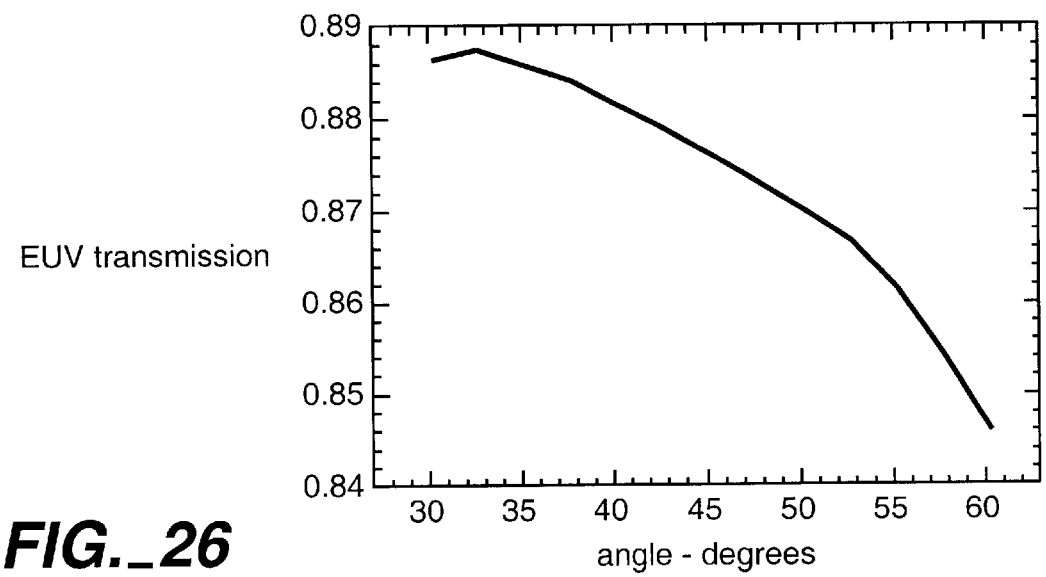
FIG._26

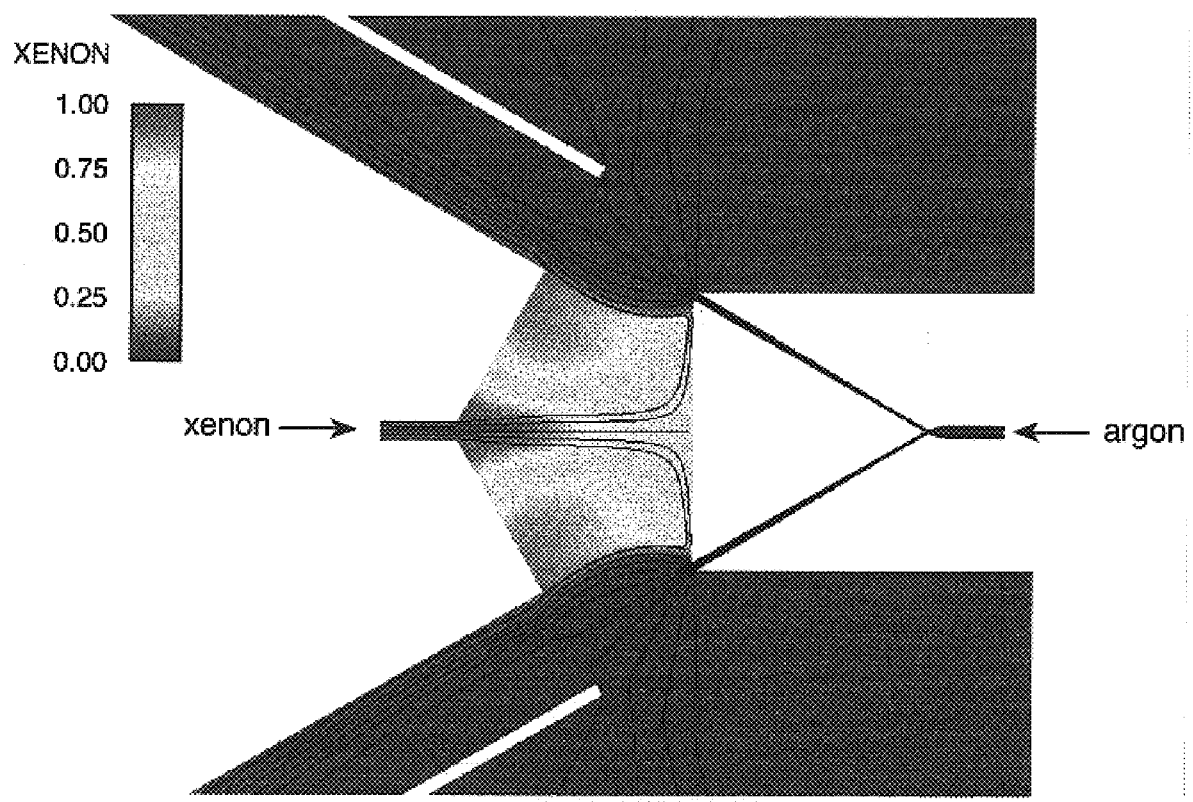
FIG._25

DISCHARGE SOURCE WITH GAS CURTAIN FOR PROTECTING OPTICS FROM PARTICLES

This invention was made with Government support under Contract No. DE-AC04-94AL85000 awarded by the U.S. Department of Energy to Sandia Corporation. The Government has certain rights to the invention.

FIELD OF THE INVENTION

This invention relates generally to the production of extreme ultraviolet and soft x-rays for projection lithography.

BACKGROUND OF THE INVENTION

The present state-of-the-art for Very Large Scale Integration ("VLSI") involves chips with circuitry built to design rules of 0.25 $\mu$m. Effort directed to further miniaturization takes the initial form of more fully utilizing the resolution capability of presently-used ultraviolet ("UV") delineating radiation. "Deep UV" (wavelength range of $\lambda$=0.3 $\mu$m to 0.1 $\mu$m), with techniques such as phase masking, off-axis illumination, and step-and-repeat may permit design rules (minimum feature or space dimension) of 0.18 $\mu$m or slightly smaller.

To achieve still smaller design rules, a different form of delineating radiation is required to avoid wavelength-related resolution limits. One research path is to utilize electron or other charged-particle radiation. Use of electromagnetic radiation for this purpose will require x-ray wavelengths. Various x-ray radiation sources are under consideration. One source, the electron storage ring synchrotron, has been used for many years and is at an advanced stage of development. Synchrotrons are particularly promising sources of x-rays for lithography because they provide very stable and defined sources of x-rays, however, synchrotrons are massive and expensive to construct. They are cost effective only when serving several steppers.

Another source is the laser plasma source (LPS), which depends upon a high power, pulsed laser (e.g., a yttrium aluminum garnet ("YAG") laser), or an excimer laser, delivering 500 to 1,000 watts of power to a 50 $\mu$m to 250 $\mu$m spot, thereby heating a source material to, for example, 250,000° C., to emit x-ray radiation from the resulting plasma. LPS is compact, and may be dedicated to a single production line (so that malfunction does not close down the entire plant). The plasma is produced by a high-power, pulsed laser that is focused on a metal surface or in a gas jet. (See, Kubiak et al., U.S. Pat. No. 5,577,092 for a LPS design.)

Discharge plasma sources have been proposed for photolithography. Capillary discharge sources have the potential advantages that they can be simpler in design than both synchrotrons and LPS's, and that they are far more cost effective. Klosner et al., "Intense plasma discharge source at 13.5 nm for extreme-ultraviolet lithography," Opt. Lett. 22, 34 (1997), reported an intense lithium discharge plasma source created within a lithium hydride (LiH) capillary in which doubly ionized lithium is the radiating species. The source generated narrow-band EUV emission at 13.5 nm from the 2-1 transition in the hydrogen-like lithium ions. However, the source suffered from a short lifetime (approximately 25–50 shots) owing to breakage of the LiH capillary.

Another source is the pulsed capillary discharge source described in Silfvast, U.S. Pat. No. 5,499,282, which promised to be significantly less expensive and far more efficient than the laser plasma source. However, the discharge source also ejects debris that is eroded from the capillary bore and electrodes. An improved version of the capillary discharge source covering operating conditions for the pulsed capillary discharge lamp that purportedly mitigated against capillary bore erosion is described in Silfvast, U.S. Pat. No. 6,031,241.

Debris generation remains one of the most significant impediments to the successful development discharge sources in photolithography. The debris particles are ejected from the surfaces of the electrode (and also the capillary in the case of a capillary discharge source) caused by the short, intense pulses of electrical energy. These particles are generally small (less than one micron) and have very large velocities (greater than 100 m/s).

SUMMARY OF THE INVENTION

The present invention is based in part on the recognition that a gas curtain can be employed to protect multilayer optics from damage by debris that is generated by an EUV discharge source. It is expected that the gas curtain, e.g., a supersonic gas jet, will deflect sufficient amounts of debris generated by the EUV source without significantly reducing EUV transmission through the curtain. In addition, by efficiently removing the gas from the vacuum environment (e.g, chamber) in which the EUV source operates, the pressure therein can be maintained at an acceptable low level which prevents further EUV transmission attenuation.

In one embodiment, the invention is directed to a device that generates extreme ultraviolet and soft x-ray radiation that includes:

an EUV discharge source that produces a beam of radiation along a path and that generates debris; and a gas curtain means for projecting a stream of gas over the path of radiation to deflect the debris into a direction that is different from that of the path of radiation.

BRIEF DESCRIPTION OF THE DRAWINGS

FIG. 1 is a cross sectional view of an electric capillary discharge source;

FIG. 2 illustrates the gas curtain conceptual design;

FIG. 3 is a schematic of an experimental apparatus;

FIG. 4 is a graph of measured pressure vs. gas flow rate in a diffuser for helium and argon gas curtains;

FIG. 5 is a graph showing the performance of the turbomolecular pump and the through put of the helium and argon curtain gases into the chamber;

FIG. 6 is a graph of the speed of the turbomolecular pump for argon and helium curtain gases;

FIG. 7 is a graph of diffuser efficiencies for argon and helium;

FIG. 8 illustrates the locations of the SEM images taken on the witness plates;

FIG. 9 is a graph showing the sensitivity to threshold of the image analysis for particle fraction at the center location of the witness plates from the "curtain" and "no curtain" tests;

FIGS. 10a and 10b show the particle fraction distribution along the horizontal (10a) and vertical (10b) centerlines of the witness plates for the "curtain" and "no curtain" cases;

FIG. 11 is a histogram of the particle sizes of the witness plates of the "curtain" and "no curtain" cases.

FIG. 12 illustrates the calculated results for a helium gas curtain for a flow rate of 76 torr l/s and chamber and diffuser pressures of 0.13 torr are 0.55 torr, respectively;

FIG. 13 is a graph of the calculated and measured diffuser efficiencies for argon and helium;

FIG. 14 illustrates the calculated results for a helium gas curtain for a flow rate of 76 torr l/s and chamber and diffuser pressures of 0.031 torr and 0.39 torr, respectively;

FIG. 15 illustrates the calculated results for the effect of the chamber and diffuser pressures on the diffuser efficiency for a helium flow rate of 76 torr l/s and a 1.91 cm diffuser;

FIG. 16 is a graph of the diffuser efficiency for argon and helium curtains for chamber pressures of 0.012 torr (argon) and 0.031 torr (helium);

FIG. 17 illustrates the calculated particle trajectory for a 20 nm tantalum particle traveling at 195 m/s into a helium gas curtain with a flow rate of 76 torr l/s and a chamber pressure of 0.031 torr;

FIGS. 18a and 18b are graphs of the calculated results for the particle deflection angle resulting from argon and helium gas curtains as a function of the gas flow rate and gas stagnation pressure, respectively;

FIG. 19 is a graph of the EUV transmission through helium and argon gas curtains as a function of position between the nozzle (x=0) and diffuser (x=2.54 cm);

FIGS. 20a, 20b, 22 and 23 illustrate three embodiments of gas curtain designs for an EUV discharge source;

FIG. 21 is a schematic showing how a particle could be deflected by a large amount by a simple gas curtain but still hit the optic;

FIG. 24 illustrates the gas flow field and particle trajectory for an annular gas curtain;

FIG. 25 illustrates the xenon mass fraction distribution for an annular gas curtain; and FIG. 26 is a graph of EUV transmission through an annular gas curtain vs. angle spanning the EUV collection zone.

DETAILED DESCRIPTION OF THE INVENTION

The gas curtain of the present invention can be employed with any EUV source that emits debris. By "EUV source" is meant any device that generates a beam EUV and soft-x ray radiation, such as, for example laser plasma and capillary discharge sources. The invention will be illustrated in conjunction with an electric capillary discharge source, but it is understood that any source can be employed.

FIG. 1 is a cross-sectional view of an electric capillary discharge source 10 which preferably comprises an insulating disk 12 that has a capillary bore 14 which is centered on-axis. The disk 12 is mounted between two electrodes 20 and 30 which are in proximity to the front and back surfaces of the disk, respectively. The disk is typically made of a ceramic material, preferably, boron nitride, and more preferably of pyrolytic boron nitride, compression annealed pyrolytic boron nitride, or cubic boron nitride. These materials are commercially available. It has been demonstrated that boron nitride, which is relatively highly thermally conductive (for a ceramic), is particularly suited for use in the electric discharge source because of its exceptional resistance to erosion.

Front electrode 20 is typically grounded and has an aperture 22 having a center that is aligned with the center of the capillary bore 14. Rear electrode 30 has a channel 32 with an inlet and an outlet. The outlet is connected to the capillary bore at the back end of disk 12 while the inlet is connected to a gas source 70. Rear electrode 30 is also connected to a source of electric potential 60 which includes a switch mechanism 62 to generate electric pulses. To facilitate the removal of heat, front and rear electrodes and capillaries are preferably encased in a thermally conductive housing 50 which in turn can be surrounded by coils 52 through which a coolant, e.g., water, is circulated. Front and rear electrodes are made of any suitable electrically conductive and erosion resistant material such as refractory metals, e.g., stainless steel. A particularly preferred material is tantalum.

The electric capillary discharge source 10 employs a pulsed electric discharge in a low-pressure gas to excite a plasma confined within a capillary bore region. A high-voltage, high-current pulse is employed to initiate the discharge thereby creating a plasma, e.g., 2–50 eV, that radiates radiation in the EUV region. The source of gas 70 contains any suitable reactive gas that can be ionized to generate a plasma from which radiation of the desired wavelength occurs. For generating extreme ultraviolet radiation and soft x-rays, xenon is preferred.

In operation, the opening of the front electrode is connected to a housing that defines a vacuum chamber. Causing an electric discharge in the capillary bore sufficient to create a plasma within the capillary bore produces extreme ultraviolet and soft x-ray radiation into the vacuum chamber which is typically maintained at a pressure of less than about $1 \times 10^{-3}$ Torr. Typically, the electric discharge creates a 20 to 50 eV plasma. The electric discharge can be generated as pulse electric discharges exhibiting a discharge rate, for example, between about 0.5 to 4 $\mu$sec. The electric capillary discharge source of FIG. 1 can be employed in extreme ultra-violet lithography (EUVL) which is conducted in a vacuum chamber because background gases absorb EUV. The EUVL system will also include optics (e.g., mirrors) positioned in the vacuum chamber that are susceptible to contamination by debris generated by the discharge source.

With the present invention, the use of a gas curtain is employed to protect the optics from such debris; specifically, a high velocity gas jet is used to deflect the particles away from the optics. It is not necessary for the curtain to stop the particles, rather it need only change their direction of motion so that they do not hit the optics. The vacuum environment of the EUVL system will result in spreading of the gas curtain which will reduce its effectiveness. This spreading can be partially offset by expanding the gas in a diverging nozzle to establish a supersonic directed flow. The jet spreading will decrease with increasing Mach number at the exit of the nozzle.

The use of a gas curtain for EUVL raises some concern for increased EUV absorption. The fraction of EUV absorbed, $f_a$, by a gas is described by Equation 1, which shows that EUV absorption increases with the gas number density, n (which increases with gas pressure), the absorption cross section, $\mu_a$, and the EUV path length, s. The path length is determined by the optical design and is assumed here to be 2 meters. The absorption cross section depends greatly on the chemical species. Some benefit can be gained by using helium rather than argon, for example, for all else being equal. In any case, the path length is large so the pressure in the chamber must be kept to a small value, depending on the gas species. Besides helium and argon other suitable gases include, for example, hydrogen, oxygen, and mixtures thereof. The speed of the gas exiting the gas outlet preferably flows at a supersonic speed preferably greater than Mach 4 and as high as about Mach 10. The actual speeds may range from about 1,000 m/s to 2,000 m/s.

$$f_a = 1 - \exp(-n\mu_a s) \tag{1}$$

In order to maintain small pressures in a vacuum chamber that contains a gas curtain a combination of strategies can be used. First, the curtain gas flow rate can be set to the minimum value that adequately deflects the particles. Second, additional vacuum pumps can be installed on the chamber. Third, a diffuser can be used that acts to capture the curtain gas while it is still at a relatively large pressure such that the captured gas can be efficiently pumped out of the chamber.

FIG. 2 shows a sketch of a simple gas curtain design. Gas (e.g. helium or argon) flows from a high pressure source (not shown) into the nozzle 210 where it expands to supersonic velocities. The gas 220 then exits the nozzle 210 and flows laterally in front of the electrode 230 of the discharge source and the resulting flux of unwanted particles. Some of this gas 240 enters the diffuser 260 and is removed by a vacuum pump (not shown). A diffuser is any gas collection device that is used in conjunction with the gas curtain. Typically, the diffuser has an aperture that faces the gas stream. The remainder of the gas 250 flows into the chamber and is removed by another vacuum pump. As a particle moves out from its point of origin toward an EUV collection optic (not shown) it enters the supersonic gas flow field. The particle is deflected by the curtain from the path 280 it would otherwise take and moves harmlessly in a trajectory 290 away from the optic.

Theory

The following discussion pertains to the theoretical basis for the gas curtain. It is understood that the scope of the claims is not limited by the theory. To be effective, the gas curtain flow rate must be large enough to deflect particles and yet not so large as to result in large chamber pressures. The effect of the gas curtain design parameters on particle deflection and gas flow rate described herein can be explained qualitatively based on simple gas dynamic theory where the expansion of the gas is assumed to be isentropic (inviscid and adiabatic). This theory will help explain the results obtained from the experiments and more detailed calculations where viscous effects and heat transfer are accounted for.

The use of small gas flow rates will help maintain low chamber pressures without the use of extraordinary numbers of vacuum pumps. Equation 2 describes the flow rate through a nozzle in the form of the throughput, Q, which is the form often used to describe the performance of vacuum pumps (independent of gas species) and is given by the product of the volumetric flow rate and the gas pressure. Equation 2 shows that Q can be reduced by decreasing the gas source pressure, $p_0$ (i.e. stagnation pressure), the nozzle throat area, $A_{th}$, and by using a gas with a larger molecular weight, W (e.g. use argon rather than helium). This latter effect is due to the inverse relationship between the gas sound speed and W, i.e. the gas sound speed (and consequently the through put) decreases with increasing W. Note that there is a limit to how much $p_0$ can be reduced and still get a supersonic expansion of the gas in the nozzle, which requires a flow where inertial forces dominate viscous forces (i.e. a large Reynolds number flow). The ratio of specific heats, $\gamma$, in Equation 2 has a value of 5/3 for monatomic gases, which includes both helium and argon. R is the universal gas constant.

$$Q = A_{th} p_0 \left(\frac{\gamma+1}{2}\right)^{\frac{1+\gamma}{2-2\gamma}} \sqrt{\frac{\gamma R T_0}{W}} \quad (2)$$

A gas curtain deflects particles through the action of a drag force. The drag force required to deflect a particle a given amount increases with both the particle mass and the particle velocity. The drag force on a particle is typically expressed in terms of a drag coefficient as, $F_D = C_D A_C \rho V_r^2/2$, where $F_D$ is the drag force, $C_D$ is the drag coefficient, $A_C$ is the cross sectional area of the particle ($A_C = \pi r^2$ for a spherical particle), $\rho$ is the local gas density and $V_r$ is the relative velocity between the particle and the gas. The conditions in the gas curtain considered here include a high mach number and a large particle Knudsen number (equal to the ratio of the molecular mean free path to the particle diameter). For these conditions $C_D$ is close to a constant value of approximately 2. Also, the gas velocity is typically large compared to the particle velocity so $V_r$ may be approximated as just the gas velocity, V. The drag force then becomes proportional to the gas momentum flux, $\rho V^2$, which is given by Equation 3, where Ma is the local gas Mach number. For all else being equal, Ma is independent of the gas species (i.e. assuming monatomic gases). Equation 3 shows that the gas momentum flux increases with $p_0$ and is independent of the gas species (i.e. W).

$$F_D \propto \rho V^2 = \gamma p_0 Ma^2 \left(1 + \frac{\gamma-1}{2} Ma^2\right)^{\frac{\gamma}{1-\gamma}} \quad (3)$$

Thus, the particle drag force required to deflect the particles determines the required value of $p_0$. For a given value of $p_0$, the gas flow rate will be larger for helium than for argon, so choosing argon will help ease the vacuum pumping requirement. However, if the vacuum pumping requirement can be easily met, helium should be chosen because it has a smaller absorption cross section.

Experimental Description

FIG. 3 shows an apparatus that was employed to test the gas curtain concept. The apparatus included a vacuum chamber 310 that houses a capillary discharge device 320, a gas nozzle 330, a diffuser 340, and a witness plate 350. The nozzle 330 had a conical shape with a throat (inlet) diameter of 0.308 mm and a exit diameter of 1.2 mm giving an area ratio of approximately 16. The diffuser 340 was located one inch (2.54 cm) downstream of the nozzle exit and was coaxial with the nozzle. Both helium and argon were used. An ALCATEL ADS 501 roots blower 370 was connected to the diffuser 340. A VARIAN 551 turbomolecular pump 360 was connected directly to the chamber 310. A one inch (2.54 cm) square silicon wafer with a multilayer coating was used as a witness plate to collect particles for examination after a test. Pressure gauges were installed at various locations including at the inlet to the gas nozzle, in the diffuser, at the inlet to the roots blower and in the chamber. A flow meter was used to measure the total flow rate through the nozzle.

Diffuser efficiency measurements: Measurements of the pump inlet pressures were used along with the pump performance curves to determine the amounts of gas entering the diffuser and the chamber. A range of diffuser diameters were considered from 0.95 to 1.91 cm. Helium flow rates up to 127 torr l/s and argon flow rates up to 38 torr l/s were used.

Particle deflection measurements: Two separate tests were carried out to measure the effectiveness of the gas curtain for deflecting particles. In each test 100,000 pulses of the capillary discharge device was used to generate particles and a clean witness plate was used for each test. In the first test the witness plate was exposed to the discharge source without the use of a gas curtain. In the second test a helium gas curtain was used with a flow rate of 76 torr l/s and the diffuser had a 1.91 cm diameter.

Model Description

Gas flow calculations: A general purpose compressible fluid mechanics code, SACARRA, developed by Sandia National Laboratories, was used to calculate the gas flow fields. This code solves the general form of the Navier-Stokes equations, i.e. the gas is assumed to be a continuum viscous fluid. This is a valid assumption for the flow field near to the nozzle and diffuser for the relatively high gas source pressures considered here. All gas flow fields were assumed to be axisymmetric.

Particle trajectory calculations: Aerodynamic drag, $F_D$, was assumed to be the only force acting on the particles which were assumed to be spheres. $F_D$ is a vector with a direction opposite to that of particle-gas relative velocity, $V_r$. A comprehensive drag coefficient $[C_D \equiv 2F_D/(A_C \rho V_r^2)]$ correlation by Henderson was used that is valid for a wide range of flow conditions including subsonic, supersonic, continuum and free molecular. (See C. B. Henderson, "Drag coefficients of spheres in continuum and rarefied flows", AIAA J., vol. 14, pp 707–708, 1976.) Given the local gas state and velocity and the particle velocity, the drag force can be evaluated. Newton's second law, $F_D = m_p dV_p/dt$, is solved for the change in particle (absolute) velocity, $V_p$, where $m_p$ is the particle mass. In this equation $F_D$ and $V_p$ are vectors and the change in $V_p$ (i.e. $dV_p$) is in the same direction as $F_D$. The particle material was assumed to be tantalum (the electrode material).

Results

Experimental results for the diffuser efficiency: The diffuser efficiency measurements relied on the pressure measurements at the inlets to the pumps. FIG. 4 shows the measured pressures in the diffuser, at the inlet to the roots blower and in the chamber (assumed to be equal to the pressure at the inlet to the turbomolecular pump) for the 1.91 cm diffuser diameter. All pressures increase with flow rate except the chamber pressure for helium which levels off to a near constant value beginning at a low flow rate. This is due to a helium flow rate entering the chamber that is near the maximum capacity of the turbomolecular pump. This can be seen in FIG. 5 where the pump performance curve is shown along with the range of operating conditions that occurred during the use of the helium gas curtain (the argon gas curtain operating conditions are also shown).

FIG. 5 shows that the pump was operated at a pumping speed (curve 1) below its maximum for argon and well below its maximum for helium. As a result, the chamber pressure increased to a value that forced the remainder of the flow into the diffuser. In contrast, the chamber pressure for argon is much less and it does not level off to a near constant value with increasing flow rate.

The speed of the turbomolecular pump (i.e. its rotation rate) decreased at a much larger rate with increasing flow rate for argon than it did for helium, as shown in FIG. 6. This limited the maximum flow rate that could be used for argon to a much smaller value than that used for helium. Not all vacuum pumps are this sensitive to gas species.

Diffusers with smaller diameters were tested using helium. The chamber pressure variation with total flow rate for each diffuser was similar to that shown in FIG. 4 for the 1.91 cm diffuser in that it leveled off approximately to a constant value. This 'constant' value increased with decreasing diffuser diameter. This is because a larger chamber pressure is required to force the excess flow (i.e. the portion of the flow not taken by the turbomolecular pump) into a smaller diffuser. Since the chamber pressure was the smallest for the largest diffuser tested (1.91 cm diameter) it was the best performer.

The measured pressures were used along with the pump performance curves to determine the amounts of flow entering the chamber and diffuser. The sum of these two flows was compared to the total flow measured with a flow meter (i.e. ideally the sum and measured total would be equal). The difference was found to be less than 10% which provides an estimate for the accuracy of the diffuser and chamber flow rates. FIG. 7 shows the results for the diffuser efficiency (1.91 cm diffuser), defined as the fraction of the total flow that enters the diffuser. The efficiency increases with flow rate for both argon and helium to very large values. This is partially due to the increase in momentum flux for both gases as the flow rate (i.e. $p_0$, see Eq. 3) is increased, and it is partially due to the increase in the chamber pressure. The efficiency is larger for argon than for helium for a given flow rate. This is because a larger gas source pressure ($P_0$) is required for argon to obtain the same flow rate as helium due to the differences in their molecular weights (see Eq. 2). The larger gas source pressure used for argon results in a larger momentum flux in the gas curtain (see Eq. 3). As shown in FIG. 4, the pressure in the diffuser is generally much larger than that in the chamber, so there is a larger pressure gradient acting to force the flow to enter the chamber rather than the diffuser. The larger momentum flux in the argon curtain helps the gas flow into the diffuser rather than into the chamber, the latter being favored by the pressure gradient.

Experimental results for particle deflection: One inch (2.5 cm) square witness plates from tests with and without a gas curtain were examined to determine the effectiveness of the curtain for deflecting particles away from the plate. The test with the curtain used helium at a flow rate of 76 torr l/s and the diffuser with a 1.91 cm diameter. The plates were examined using a scanning electron microscope to capture images at nine evenly spaced locations arranged along the vertical and horizontal plate centerlines. FIG. 8 shows a schematic of the image locations taken on the plates. Each image designated "A" was taken at a magnification of 1000× which corresponds to image dimensions of 0.112 by 0.088 mm.

The images were converted to binary in order to contrast the particles from the bare plate surface. A threshold must be chosen to separate black (particles) from white (plate). Since the choice of threshold is somewhat subjective a range of values were tested to determine the sensitivity of the results to the choice of threshold. FIG. 9 shows the results of this sensitivity analysis where the images at the center of plate were used. The figure shows the fraction of each image that is black, i.e. the particle fraction. For small values of the threshold a large portion of the bare plate is converted to black while for large thresholds much of the particle surfaces is converted to white. There is an intermediate range of thresholds where the ratio of the particle fractions for the 'no curtain' and 'curtain' cases is approximately constant. A threshold of 200 was chosen for the image analysis of both the 'curtain' and 'no curtain' cases and for all plate locations in order to obtain objective results.

FIGS. 10a and 10b show the particle fraction distribution along the horizontal (FIG. 10a) and vertical (FIG. 10b) centerlines of the witness plates from the 'curtain' and 'no curtain' cases. The results show that the particle fraction was approximately 0.09% for the 'no curtain' case, and that the particle fraction was approximately a factor of 10 less than that for the 'curtain' case. The particle fraction appears to vary randomly with location on the plates. This may be due to an insufficient number of deposited particles to establish good statistical averages.

While the reduction in particles resulting from the plate is encouraging in some respects, a much larger reduction is needed. The deposition of particles on the witness plate protected by the gas curtain may have been due to extreme values of either their initial velocities or their initial trajectory angles (or both). These particles may have had very large initial velocities, which would reduce their deflection angle, or their initial directions of motion may have been away from the witness plate, and then the curtain deflected them back into the plate.

The image analysis for the particle sizes are shown in FIG. 11 where the particle size is expressed in terms of the area a particle occupies on the witness plate. Here the results from all nine images taken on each plate were combined and shown in a histogram format, i.e. particle sizes were grouped into finite sized bins and the number of particles falling into each bin are shown. The results show that the number of particles decreases with increasing particle size for both the 'curtain' and 'no curtain' cases, and that the gas curtain appears to have deflected a larger percentage of the smaller particles than the larger particles.

In summary the experimental results showed that the helium gas curtain with a flow rate of 76 torr l/s resulted in a significant and unmistakeable reduction in particulate debris deposited on the witness plate. However, a much larger reduction is needed in order to adequately protect the sensitive optics that must be used to collect EUV. Also, the chamber pressure rose to levels in the experiments that would result in an unacceptable loss of EUV. Larger gas flow rates will be required to protect the optics, and at the same time the chamber must be maintained at lower pressures by using more powerful vacuum pumps or by using better gas curtain designs. Calculations were carried out to study the effect of larger gas flow rates and smaller chamber pressures on particle deflection and diffuser efficiency.

Results from the gas flow calculations: FIG. 12 shows the calculated gas flow field for a flow rate of 76 torr l/s of helium where the experimentally measured chamber and diffuser pressures (0.13 torr and 0.55 torr, respectively) were used as boundary conditions. The non-arrowed lines are pressure contours and where they group closely together indicates the formation of a barrel shock wave 123. The arrowed lines are gas flow streamlines from the aperture of nozzle 121; note that some of the gas enters the diffuser 122 and some does not. Calculations such as these were carried out to obtain the diffuser efficiency for the conditions of the experiments discussed above in order to validate the model.

FIG. 13 shows the calculated results for the diffuser efficiency where the experimentally measured diffuser and chamber pressures for the corresponding flow rates were used as boundary conditions. The use of the measured pressures as boundary conditions permits a direct comparison of the calculated and measured diffuser efficiencies, where the latter are also shown. As can be seen, the calculated results for helium are close to the measured results, although the calculations under predict the efficiency for the larger flow rates. In contrast, the calculations for argon over predict the efficiency. This latter discrepancy may be due to condensation of the argon which is not accounted for in the calculations. Condensation has the effect of decreasing the Mach number at the nozzle exit which increases the degree of jet spreading and decreases the diffuser efficiency.

As shown previously, the chamber pressures were large for helium in the experiments (see FIG. 4) and would result in an intolerable loss of EUV by gas absorption. These high pressures can be avoided by using more powerful vacuum pumps. Calculated results for the effect of a chamber pressure of 0.031 torr are shown in FIG. 14 for a helium flow rate of 76 torr l/s. This chamber pressure gives a more acceptable loss of EUV (10% over a two meter path length). The diffuser pressure was set to a value consistent with the use of the ADS 501 roots blower to pump on the diffuser. The jet spreading is much larger in FIG. 14 (small chamber pressure) than in FIG. 12 (large chamber pressure). The streamlines indicate that less of the flow enters the diffuser.

FIG. 15 shows the effect of the chamber pressure on the diffuser efficiency for a constant diffuser pressure of 0.55 torr (the red curve) and a helium flow rate of 76 torr l/s and a 1.91 cm diffuser. The efficiency increases with chamber pressure, which implies that the large efficiencies obtained in the experimental results are partially due to the large chamber pressures that developed there. FIG. 15 also shows the effect of the diffuser pressure on the efficiency for a constant chamber pressure of 0.031 torr. The efficiency decreases with increasing diffuser pressure. Thus, the diffuser efficiency is a function of the diffuser size, the distance between the nozzle and diffuser (results for this effect not shown), the total gas flow rate, the gas species, the chamber pressure (or alternatively, the chamber vacuum pump) and the diffuser pressure (or alternatively, the diffuser vacuum pump).

Although the diffuser efficiency was small (less than 0.55) for a chamber pressure of 0.031 torr (for helium) as shown in FIG. 15, it increases to larger values with increasing total flow rate. This is shown in FIG. 16 where the efficiency is shown for helium and argon for fixed chamber pressures of 0.031 torr and 0.012 torr, respectively. The efficiency for large flow rates is between 70% and 75% for helium and between 80% and 85% for argon. The small variations seen in these results at the larger flow rates appears to be due to the interaction of shock waves with the lip of the diffuser. The efficiency is larger for argon than for helium, for the same total flow rate, due to the larger momentum flux in the argon curtain (see Eq. 3). Recall that the calculations over predicted efficiencies for argon (see FIG. 11) so the difference between argon and helium efficiencies should be studied further in experiments for the large total flow rates shown in FIG. 16.

Since the diffuser efficiency increases with the total flow rate, the fraction of the flow entering the chamber decreases. Note that this does not mean that the actual flow rate entering the chamber decreases with flow rate, just the chamber fraction, while the chamber flow rate increases with total flow rate.

Particle trajectory calculations were carried out using the calculated gas flow fields. In each case a 20 nm tantalum particle with an initial velocity of 195 m/s was assumed. Also, it was assumed that the particle enters the gas curtain midway between the nozzle and diffuser and that it travels through the axis of symmetry of the gas flow field. FIG. 17 shows a sample calculation for a helium flow rate of 76 torr l/s and a chamber pressure of 0.031 torr. Note that the chamber pressure affects both the gas flow field and (consequently) the particle deflection angle, where the deflection angle increases with increasing chamber pressure. The particle deflection angle for the case shown in FIG. 17 is 26°.

The effect of gas flow rate and gas species on the particle deflection angle is shown in FIG. 18 for a 20 nm tantalum particle moving at 195 m/s. A chamber pressure resulting in a 10% loss of EUV was used in the calculations (i.e. 0.012 torr for argon and 0.031 torr for helium). The witness plate experiments used helium at a flow rate of 76 torr l/s. FIG. 18 shows that this results in a deflection angle of 26°, and that deflection angles greater by a factor of 2.7 can be obtained by using a flow rate of 384 torr l/s. Note that the effect of flow rate on the particle deflection depends on the particle characteristics.

The particle deflection angle is larger for argon than for helium for the same flow rate (FIG. 18a). This is due to the larger momentum flux of argon than that of helium for the same flow rate. That is, a larger value of $p_0$ is required to obtain the same flow rate of argon as helium (see Eq. 2). A larger value of $p_0$ results in a larger momentum flux (see Eq. 3). When the results are plotted versus the stagnation pressure, as in FIG. 18b, the particle deflection angles are comparable for the two gases. This is consistent with Equation 3, which shows the momentum flux to be proportional to $p_0$ and to be independent of gas species.

The EUV transmission perpendicular to the axis of the gas curtain is shown in FIG. 19 as a function of position between the nozzle (x=0) and the diffuser (x=2.54 cm). Results for three different stagnation pressures ($p_0$) are shown, where the corresponding flow rates for helium and argon are noted in the figure. The transmission is the smallest near the nozzle where the gas velocity is the smallest and the gas density is the largest. The transmission is better for helium than for argon for the same stagnation pressure due to the smaller absorption cross section for helium than for argon, for the same stagnation pressure. The transmission is poor near the nozzle for the larger flow rates so it may be necessary to keep the first centimeter (more or less) of the curtain out of the path of the EUV (e.g. by moving the nozzle further away from the capillary discharge device).

Additional Embodiments of the Gas Curtains. FIGS. 20a and 20b illustrate a design wherein the gas curtain spans the entire diameter of the front electrode 201. The device, which includes a gas source 202 and diffuser 203, is particularly suited when particles originate from anywhere on the surface of the electrode. The elongated gas nozzle of the gas source and diffuser are used to provide a gas curtain that is as wide as the electrode but is thin in the direction perpendicular to the electrode surface so as to minimize the gas flow rate and EUV absorption.

FIG. 21 illustrates another problem which may be encountered in designing gas curtain devices. The nozzle 210, front electrode 230, and diffuser 250 were described previously in FIG. 2. As illustrated, EUV collection zone is an axisymmetric 30° spherical sector with an interior 60° angle, i.e. when viewed in cross section it is composed of two 30° sectors separated by 60°. A particle that initially moves toward the optic within one of these sectors could get deflected by as much as 120° along path 1 and still hit the optic. That is, after the deflection, the particle takes a path that is toward the optic within the sector on the other side. Thus, very large gas curtain flow rates that result in deflection angles greater than 120° may be required with some types of gas curtain design in order to adequately protect the optic.

The curtain designs shown in FIGS. 22 and 23 require smaller deflection angles to protect the optic than the potentially large deflection angles required in the gas curtain designs described above. The design shown in FIG. 22 employs an annular nozzle 221 and an annular diffuser 222. Here the gas curtain surrounds the source of the particles (the capillary 223 and electrode 234) and the particle deflection angle required to protect the optic is only 30° (for particles originating from near the capillary exit).

The design shown in FIG. 23 is similar to that shown in FIG. 22, except the gas flows in the opposite direction. Here the annular nozzle 231 surrounds the capillary 232 and electrode 233 and the diffuser 234 is located some distance away from the electrode and is coaxial with the capillary. The gas flow 235 deflects particles 236 into the diffuser where they are entrained by the gas and flow towards a vacuum pump (not shown) that is connected to the diffuser.

Results from calculations for the performance of the annular gas curtain design shown in FIG. 22 are shown in FIGS. 24–26. FIG. 24 depicts the gas flow field and particle trajectory away from EUV collection zone 255. The model includes the capillary 251 as well as the annular nozzle 252 and annular diffuser 253. The calculations assumed the curtain gas was argon, an ADS 501 roots blower on the diffuser, a chamber pressure of 0.012 torr, and a xenon pressure on the upstream side of the capillary of 1.5 torr. An argon stagnation pressure of 168 psi was used resulting in a total flow rate of 116 torr l/s. For these conditions the diffuser capture efficiency is 74% giving a flow rate into the chamber of 30 torr l/s. The particle calculations assumed a 20 nm tantalum particle with an initial velocity of 195 m/s. The particle deflection angle for an initial particle trajectory angle of 45° (the case shown) was 35°. The pressure in the region near the capillary exit enclosed by the annular curtain rose to 0.4 torr. This pressure is less than the xenon pressure on the upstream side of the capillary so argon did not flow into the capillary, which would disrupt the capillary discharge process. Particle 254 is shown being deflected from EUV collection zone 255 and away from an optic.

FIG. 25 shows the xenon mass fraction distribution, where a value of one indicates the gas is pure xenon and a value of zero indicates the gas is pure argon. The results show that the gas 'trapped' within the region surrounded by the annular gas curtain is not pure xenon, which is due to xenon transport out of this region by diffusion and convection. This helps reduce the EUV absorption from that which would occur if the gas were pure xenon because xenon has a much larger absorption cross section than does argon. Further reductions in the xenon concentration in the 'trapped' region could be obtained by several different methods, including 1) pumping directly on the region, 2) introducing helium gas into the region so as to flush the xenon out, or 3) introducing an asymmetry on one side of the diffuser so as to cause argon from the curtain to enter the region on one side and exit the other, which would also flush xenon out of the region.

FIG. 26 shows the EUV transmission (one minus the EUV absorption) starting from the capillary exit and extending out through the curtain. The results are shown as a function of angle spanning the EUV collection zone (i.e. from 30+ to 60°). In addition to the EUV absorbed over this distance, another 10% of what is left (i.e., that shown in FIG. 26) would be absorbed in the argon (at 0.012 torr) that fills the remainder of the chamber. This would result in a total transmission (after the additional about 2 m of propagation through the chamber) ranging from 76% to 80% (i.e. a total absorbed fraction ranging from 20% to 24%). Based on these results the annular gas curtain design appears very promising for application to a capillary discharge EUV source.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A device that generates extreme ultraviolet and soft x-ray radiation that comprises:
   an EUV source that produces a beam of radiation along a path and that generates debris; and
   a gas curtain means for projecting a stream of gas at supersonic speeds over the path of radiation to deflect the debris into a direction that is different from that of the path of radiation.

2. The device of claim 1 wherein the EUV discharge source emits radiation that travels through an annular shaped region and the gas curtain means comprises a source of gas having a gas outlet that projects the stream of gas into the annular shaped region at a sufficient speed to cause the debris particles to be entrained in the gas.

3. The device of claim 2 wherein the gas curtain means further comprises a gas collecting member having a gas inlet through which gas containing entrained debris particles is recovered.

4. The device of claim 1 wherein the EUV discharge source comprises:
   (a) a body that defines a capillary bore that has a proximal end and a distal end;
   (b) a first electrode defining a channel that has an inlet that is connected to a source of a reactive gas and an outlet end that is in communication with the distal end of the capillary bore;
   (c) a second electrode positioned to receive radiation emitted from the proximal end of the capillary bore and having an opening through which radiation is emitted; and
   (d) a source of electric potential that is connected across the first and second electrodes.

5. The device of claim 4 wherein a majority of the radiation that is emitted travels through an annular shaped region and the gas curtain means includes a source of gas having a gas outlet that projects the gas into the annular shaped region at a sufficient speed to cause debris particles to be entrained in the gas.

6. The device of claim 5 further including a gas collecting member having a gas inlet through which gas containing entrained debris particles is recovered.

7. The device of claim 6 wherein the gas inlet of the gas collecting member is positioned adjacent the second electrode and the gas outlet is positioned opposite the first electrode to project a stream of gas into the emitted radiation wherein the stream of gas exiting the gas outlet travels in a direction that is substantially transverse to that of the path of the emitted radiation.

8. The device of claim 6 wherein the collecting member comprises a gas diffuser defining a channel that is positioned opposite the second electrode and the gas outlet is positioned adjacent the second electrode to project a stream of gas into emitted radiation wherein the stream of gas exiting the gas outlet travels in a direction that is substantially transverse to that of the path of the emitted radiation.

9. The device of claim 4 wherein the front electrode is grounded.

10. A method of producing extreme ultra-violet and soft x-ray radiation that comprises the steps of:
    (i) providing an EUV source that produces a beam of radiation along a path and that generates debris; and
    (ii) projecting a stream of gas at supersonic speeds over the path of radiation to deflect the debris into a direction that is different from that of the path of radiation.

11. The method of claim 10 wherein the EUV discharge source emits radiation that travels through an annular shaped region and step (i) comprises projecting the stream of gas into the annular shaped region at a sufficient speed to cause the debris particles to be entrained in the stream of gas.

12. The method of claim 11 further comprising collecting the gas that contains the entrained debris particles.

13. The method of claim 10 wherein the EUV discharge source comprises:
    (a) a body that defines a capillary bore that has a proximal end and a distal end;
    (b) a first electrode defining a channel that has an inlet that is connected to a source of a reactive gas and an outlet end that is in communication with the distal end of the capillary bore;
    (c) a second electrode positioned to receive radiation emitted from the proximal end of the capillary bore and having an opening through which radiation is emitted; and
    (d) a source of electric potential that is connected across the first and second electrodes.

14. The method of claim 13 wherein a majority of the radiation that is emitted travels through an annular shaped region and the step (i) comprises projecting the gas into the annular shaped region at a sufficient speed to cause debris particles to be entrained in the stream of gas.

15. The method of claim 14 further comprising collecting the gas that contains the entrained debris particles.

16. The method of claim 13 wherein the front electrode is grounded.

17. A method of producing extreme ultra-violet and soft x-ray radiation that comprises the steps of:
    (a) providing an electric discharge plasma source that comprises a:
        (i) body that defines a capillary bore that has a proximal end and a distal end;
        (ii) a first electrode defining a channel that has an inlet that is connected to a source of gas and an outlet end that is in communication with the distal end of the capillary bore;
        (iii) a second electrode positioned to receive radiation emitted from the proximal end of the capillary bore and having an opening through which radiation is emitted, wherein a majority of the radiation that is emitted travels through an annular shaped region;
        (iv) a source of electric potential that is connected across the first and second electrodes;
        (v) a source of second gas having a gas outlet that projects inert gas into the annular shaped region at supersonic speeds to cause debris particles, that are generated by the discharge plasma source, to be entrained in the inert gas; and
        (vi) a gas collecting member having a gas inlet through which inert gas containing entrained debris particles is recovered;
    (b) introducing second gas from the source of second gas into the channel of the first electrode and into the capillary bore; and
    (c) causing an electric discharge in the capillary bore sufficient to create a plasma within the capillary bore thereby producing radiation of a selected wavelength.

18. The method of claim 17 wherein the gas inlet of the gas collecting member is positioned adjacent the second electrode and the gas outlet is positioned opposite the first electrode to project a stream of inert gas into the emitted radiation wherein the stream of gas exiting the gas outlet travels in a direction that is substantially transverse to that of the path of the emitted radiation.

19. The method of claim 17 wherein the collecting member comprises a gas diffuser defining a channel that is positioned opposite the second electrode and the gas outlet is positioned adjacent the second electrode to project a stream of inert gas into emitted radiation wherein the stream of inert gas exiting the gas outlet travels in a direction that is substantially transverse to that of the path of the emitted radiation.

20. The method of claim 17 wherein the pressure within the vacuum chamber during step (c) is less than about $10^{-1}$ torr.

21. The method of claim 17 wherein step (c) creates a 20–50 eV plasma.

22. The method of claim 17 wherein step (c) comprises causing a pulsed electric-discharge for between 0.5 to 4 micro sec.

23. The method of claim 17 wherein the speed is between 1000 m/s to 2000 m/s.

24. The method of claim 17 wherein the speed achieved has a Mach number greater than 4.

* * * * *